Nov. 23, 1965 R. B. DOME 3,219,917

FILTER COUPLING CIRCUIT

Filed Aug. 30, 1962

INVENTOR:
ROBERT B. DOME,

BY Frank J. Thompson
HIS ATTORNEY.

United States Patent Office 3,219,917

Patented Nov. 23, 1965

3,219,917

FILTER COUPLING CIRCUIT

Robert B. Dome, Geddes Township, Onondaga County, N.Y., assignor to General Electric Company, a corporation of New York Filed Aug. 30, 1962, Ser. No. 220,478

1 Claim. (Cl. 323—76)

Figure 1:
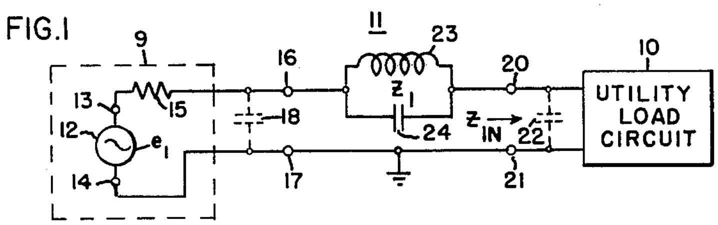

This invention relates to a circuit arrangement utilizing a low-pass coupling filter and more particularly to a low-pass filter coupling circuit which is terminated in a capacitive impedance.

Low-pass filter coupling circuits having a desirable sharp attenuation characteristic at the filter cutoff frequency, $f_c$, are generally terminated in a resistive impedance, for frequencies within the pass band, in order to provide maximum power transfer from a source of alternating voltage to a utility load circuit. This terminating impedance generally comprises the impedance, $Z_{in}$, seen looking into the utility circuit.

At times it is desirable to provide a circuit arrangement which includes a low-pass filter circuit for coupling a voltage source, having a resistive source impedance $R_s$, to a utility load circuit having a primarily capacitive input impedance within the pass band. For example, in circuit arrangements wherein a pair of input terminals of the load circuit are coupled to relatively negatively biased control and cathode electrodes of an electron discharge device, the interelectrode dissipative impedance is for all practical purposes infinite while the interelectrode capacitance $C_{gk}$ provides a primarily capacitive input impedance $Z_{in}$. A specific advantage in providing a capacitive terminating arrangement is to permit twice the input voltage to be obtained at these input electrodes as compared to the input voltage obtainable with the referred-to resistive terminating arrangement.

Known low-pass filter coupling circuits which are designed for termination in a resistive impedance and which in practice are terminated in a capacitive impedance, although providing increased output voltage over the resistive terminating arrangement, do not provide desirable uniform frequency response and sharp cutoff characteristics.

Accordingly, it is an object of this invention to provide a circuit arrangement having a low-pass filter coupling circuit which is terminated with a capacitive impedance.

Another object of this invention is to provide a circuit arrangement having a low-pass filter coupling circuit which is terminated with a capacitive impedance and which provides a desired substantially uniform frequency response and sharp cut-off characteristic.

A further object of this invention is to provide a circuit arrangement having a low-pass filter coupling circuit which is arranged as a $\pi$ type filter and includes shunt output and shunt input capacitive impedances of an alternating source and utility circuit, respectively, as elements of the filter.

In accordance with the present invention, a circuit arrangement is provided comprising a source of alternating voltage having a resistive source impedance $R_s$ and a shunt output capacitance $C_{out}$, a utility load circuit having a primarily capacitive input impedance $Z_{in}$ which is provided by a shunt input capacitance $C_{in}$, and a coupling circuit arranged as a low-pass $\pi$ type filter for intercoupling the source and utility circuit. The filter circuit comprises a series impedance $Z_1$ having a parallel coupled inductance $L_1$ and capacitance $C_1$, a shunt input capacitance $C_2$ comprising the capacitance $C_{out}$ and a shunt output capacitance $C_3$ comprising the capacitance $C_{in}$. The filter circuit elements are arranged for providing a uniform low-pass frequency response from zero frequency to the cutoff frequency to within ±0.6 db of the response at zero frequency and a sharp cutoff characteristic wherein the cutoff frequency is 80% of the frequency of highest attenuation at the foot of the cutoff slope in accordance with the relations:

$$f_c R_s = \frac{0.180}{C_1} = \frac{0.0725}{C_2} = \frac{0.145}{C_3}$$

and $$L_1 = \frac{0.0162}{f_c^2 C_1}$$

Figure 2:
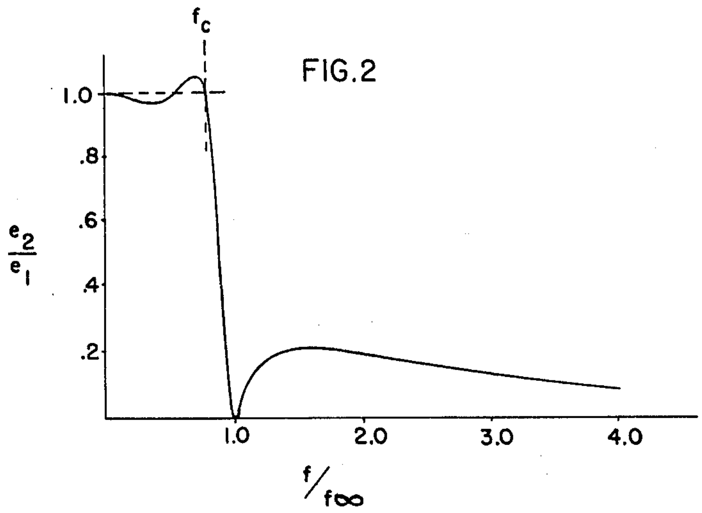
Figure 3:
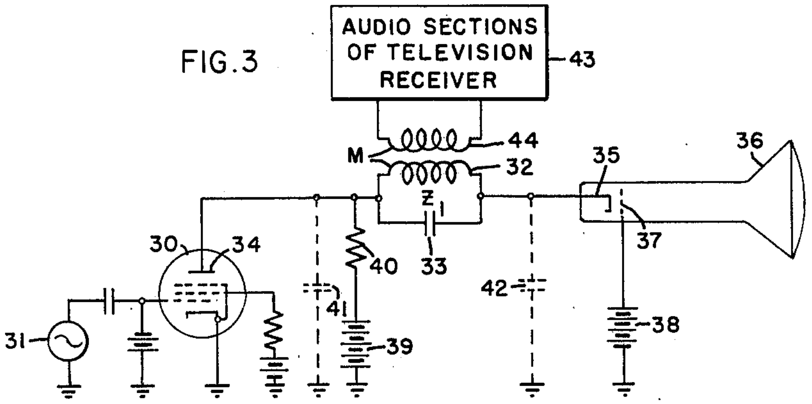

Further objects, features and the attending advantages of this invention will be apparent with reference to the following specification and drawings in which:

FIGURE 1 is a diagram partly in block form of a circuit arrangement utilizing the filter coupling circuit of the present invention, FIGURE 2 is a diagram illustrating a frequency response characteristic obtained with the filter coupling circuit of FIGURE 1, and FIGURE 3 is a circuit diagram of a circuit arrangement utilizing the filter circuit of the present invention.

Referring now to FIGURE 1, a circuit arrangement is illustrated which includes a source of alternating voltage 9, a utility load circuit 10, and a low-pass filter coupling circuit which is indicated generally by 11. The source 9 includes a voltage generator 12 which provides an alternating voltage $e_1$ between generator terminals 13 and 14 and a resistive source impedance 15. The generator 12 and source impedance 15 are connected between a pair of output terminals 16 and 17. A shunt capacitance $C_{out}$ which includes the source shunt capacitance and stray capacitance existing between the terminals 16 and 17 is indicated as a capacitor 18. The utility load circuit 10 includes a pair of input terminals 20 and 21. An input impedance $Z_{in}$, seen looking into the terminals 20, 21 is capacitive and is provided by an input capacitance $C_{in}$ indicated as a capacitance 22 coupled between the input terminals. A series impedance $Z_1$ comprising a parallel coupled inductance $L_1$ and capacitance $C_1$ indicated as elements 23 and 24, respectively, is coupled between terminals 16 and 20. From FIGURE 1, it is apparent that the series impedance $Z_1$ along with shunt input and output capacitances, $C_2$ and $C_3$ respectively, which comprise capacitances 18 and 22 respectively, form a $\pi$ type filter circuit.

In accordance with a feature of this invention, the $\pi$ filter circuit elements and source impedance $R_s$ of FIGURE 1 are arranged for providing a substantially uniform low-pass band pass characteristic and a relatively sharp cutoff frequency characteristic beginning at a frequency $f_c$. These circuit elements are arranged in accordance with the relations:

$$f_c R_s = \frac{0.18}{C_1} = \frac{0.0725}{C_2} = \frac{0.145}{C_3}$$

and $$L_1 = \frac{0.0162}{f_c^2 C_1}$$

When the capacitances 18 and 22 are of insufficient capacity to satisfy these relations, additional fixed capacity may be provided in shunt with these elements. In providing these relations between the indicated circuit elements, a desirable low-frequency band pass characteristic and relatively sharp cutoff characteristic, as indicated in FIGURE 2, is obtained. In FIGURE 2, a curve of the ratio of the output voltage $e_2$ existing between terminals 20 and 21 to the input voltage $e_1$ of generator 12 versus the ratio of the actual frequency to the frequency of infinite attenuation is shown. The frequency of infinite attenuation, $f\infty$, indicated therein is defined as $$f\infty=\frac{f_c}{0.8}=\frac{1}{2\pi\sqrt{L_1C_1}}$$

FIGURE 3 illustrates a circuit diagram for a television receiver which advantageously embodies the present invention wherein the source 9 and utility circuit 10 of FIGURE 1 are respectively a video amplifier and a picture tube. A video amplifier comprising a pentode electron discharge amplifying device 30 is provided for amplifying a video signal derived from the alternating source 31. A low-pass coupling circuit comprising an impedance $Z_1$, equivalent to the impedance $Z_1$ of FIGURE 1, and which includes an inductance 32, and a capacitance 33, couples an amplified video signal from an anode 34 of the device 30 to a cathode electrode 35 of a cathode ray picture tube 36. A control electrode 37 of the picture tube 36 is maintained at a positive potential by a voltage source 38 having a positive terminal coupled thereto while the cathode electrode 35 is maintained at a more positive potential than the electrode 37 by a video amplifier D.C. anode operating potential provided by a source 39 and load resistor 40 via the low resistance of inductance 32. A capacitance 41 comprising output and stray capacitance of the video amplifier represents the shunt input capacitance $C_2$ while a capacitance 42 comprising the interelectrode capacitance of electrodes 35 and 37 represents the output shunt capacitance $C_3$ of the filter of FIGURE 1. The amplifying device 30 is equivalent to the source 9 of FIGURE 1 wherein the internal plate impedance $r_p$ of the device 30 in parallel with the load resistor 40 represents the source resistance 15 of FIGURE 1. The $\pi$ type filter of FIGURE 3 including the inductance 32 and capacitors 33, 41 and 42 and source impedance of the device 30 is arranged in accordance with the above relations to provide a desired low-pass characteristic and cutoff frequency of approximately 3.6 megacycles.

Audio circuits 43, in a television receiver utilizing the circuit of FIGURE 3, can derive an audio signal from the impedance $Z_1$ of the filter circuit via an inductance 44 which is mutually coupled to the inductance 32. An audio intercarrier frequency voltage will be developed across the inductance 44 by the mutual coupling M. At frequencies within the pass band, however, the impedance $Z_1$ represents a low impedance to the audio intercarrier frequency and only small voltages will be developed in the inductance 44. This particular arrangement is advantageous in that trap circuits may be eliminated from prior signal processing circuits in a television receiver.

While I have illustrated and described and have pointed out in the annexed claim certain novel features of my invention, it will be understood that various omissions, substitutions and changes in the forms and details of the system illustrated may be made by those skilled in the art without departing from the spirit of the invention and the scope of the claim.

What I claim as new and desire to secure by Letters Patent of the United States is:

A circuit arrangement comprising: a source of alternating voltage having a resistive source impedance $R_s$ and a shunt output capacitance $C_{out}$; a load circuit having a capacitive input impedance $Z_{in}$ provided by a shunt input capacitance $C_{in}$; a low-pass filter circuit for coupling an alternating voltage from said source to said load circuit; said filter circuit comprising a series impedance $Z_1$ including a parallel connected inductance $L_1$ and capacitance $C_1$, a shunt input capacitance $C_2$ comprising said capacitance $C_{out}$, and a shunt output capacitance $C_3$ comprising said capacitance $C_{in}$ wherein the following idealized relationships exist:

$$f_cR_s=\frac{0.180}{C_1}=\frac{0.0725}{C_2}=\frac{0.145}{C_3}$$

and $$L_1=\frac{0.0162}{f_c^2C_1}$$

References Cited by the Examiner

UNITED STATES PATENTS

| | | | |
|---|---|---|---|
| 1,654,071 | 12/1927 | De Monte | 333—70 |
| 2,138,341 | 11/1938 | Crosby | 333—70 |
| 2,983,862 | 5/1961 | Montner | 323—61 |

MAX L. LEVY, *Primary Examiner.*

GEORGE J. BUDOCK, *Examiner.*